United States Patent [19]

Im

[11] Patent Number: 5,298,770
[45] Date of Patent: Mar. 29, 1994

[54] POWER SWITCHING MOS TRANSISTOR

[75] Inventor: Pil K. Im, Bucheon, Rep. of Korea

[73] Assignee: Samsung Electronics Co. Ltd., Suwon, Rep. of Korea

[21] Appl. No.: 928,021

[22] Filed: Aug. 11, 1992

[30] Foreign Application Priority Data

Aug. 22, 1991 [KR] Rep. of Korea .................... 91-14568

[51] Int. Cl.$^5$ ..................... H01L 29/78; H01L 23/48; H01L 29/46; H01L 29/54
[52] U.S. Cl. ..................... 257/139; 257/630; 257/652; 257/399
[58] Field of Search ............... 257/133, 139, 630, 786, 257/394, 398, 399, 400, 409, 652, 630

[56] References Cited

U.S. PATENT DOCUMENTS

| | | | |
|---|---|---|---|
| 4,333,225 | 6/1982 | Yeh ........................ | 257/341 |
| 4,801,986 | 1/1989 | Chang et al. ............. | 257/139 |
| 4,837,606 | 6/1989 | Goodman et al. ......... | 257/139 |
| 5,031,009 | 7/1991 | Fujihira ................... | 257/139 |
| 5,229,642 | 7/1953 | Hara et al. ............... | 257/691 |

FOREIGN PATENT DOCUMENTS 2-156572  6/1990  Japan .................................. 257/335

Primary Examiner—Andrew J. James
Assistant Examiner—Stephen D. Meier
Attorney, Agent, or Firm—Watson, Cole, Grindle & Watson

[57] ABSTRACT

A power switching metal oxide semiconductor (PSMOS) transistor comprises a plurality of vertical double-diffused MOS (VDMOS) transistors formed on a semiconductive substrate of a first type conductivity and a device for bypassing avalanche carriers generated at the time of turning OFF the vertical double-diffused MOS transistors. The bypass device includes a first semiconductive region, which is spaced from the MOS transistor, of a second type conductivity formed on the semiconductor substrate and a conductive line for connecting the first semiconductive region to a source electrode of the MOS transistor.

8 Claims, 3 Drawing Sheets

POWER SWITCHING MOS TRANSISTOR

BACKGROUND OF THE INVENTION

(1) Field of the Invention

The present invention relates to power switching metal oxide semiconductor (PSMOS) transistors, and more particularly to such PSMOS transistors which are improved so as not to be affected by stored energy flowing from an inductive load.

(2) Related Art

The power switching element of the present invention, for example, is a discrete element, and includes an output metal oxide semiconductor (MOS) transistor driven by gate electrodes, an insulated gate bipolar transistor (IGBT) or an integrated circuit comprising those elements.

A double diffused MOSFET (DMOS) is generally used as a PSMOS field effect transistor (FET), and such a DMOS is formed by contacting a plurality of unit FET cells in a row. In the case of a PSMOS transistor, for example, research and development have laid great emphasis on the basis characteristics of general devices. However, in the case where a switching element is attended with an inductive load according to the variety of applied circuits, the energy stored in a coil can be absorbed into the switching element. In the above case, since there was something remaining to study concerning the protection of such switching elements, these switching elements were often withheld from such additional use.

FIG. 1 illustrates a PSMOS transistor, and is a sectional view of a PSMOS transistor including a transistor having the structure of a vertical diffused MOS (VDMOS) and a gate electrode pad relating thereto. In FIG. 1 a portion identified by reference 100 has a first conductivity type, i.e. n-type, semiconductive substrate and serves as a drain; portions identified by reference numeral 101 have a second conductivity type opposite to the first conductivity type, i.e. p-wells, and these wells 101 are formed of more than two separated regions in the n-type semiconductive substrate 100. N-type impurity regions are formed thinly on each p-well 101 to form source regions 102. The reference letters appearing in FIG. 1 designate the following elements: (1) gate oxide films 103; (2) a field oxide film 104; (3) gate electrodes 105 formed of polysilicon; (4) inter-layer insulating films 106; (5) a source electrode 107 formed of metal; (6) a window 108 is formed to contact the source regions 102 and the source electrode. Further, a gate electrode pad 109 is deposited on the gate oxide films 103 and inter-layer insulating films 106 are double deposited on the p-wells. A drain electrode D of this VDMOS transistor is connected to the n-type substrate 100, and when this transistor is turned ON with an appropriate bias applied, a channel C is formed on portions identified by the letter "C". The n-type source regions 102 are connected to each other through the channels C between the n-type substrate 100, and the current that flows from the source regions 102 to the drain region 100 is controlled by the voltage applied to the gate electrodes 105.

In an N-channel PSMOS transistor, layers of the same conductivity as that of the well-forming region of the PSMOS transistor, i.e. the p-type impurity regions 101 are placed underneath a gate bonding pad completely separated from the source electrode 107 or another pad.

While such a PSMOS transistor is turned ON, in the case of an inductive load that is connected to this PSMOS transistor, a predetermined amount of energy is stored in the inductive load by the current thereof. However, when this PSMOS is turned OFF, the inductive load, i.e. the energy stored in the coil is released through the PSMOS transistor. At this time, a leakage current occurs by avalanche carriers formed between the n-type substrate and the p-type semiconductor layer flows to the source regions of the PSMOS transistor (MOSTR) via the base layer of a parasitic bipolar transistor within the PSMOS transistor, which is shown in FIG. 2, which is an enlarged view of the region "A" of FIG. 1. The above-mentioned parasitic bipolar transistor TR para is formed to be of an NPN type in the source regions 102, p-wells 101 and drain region 100. At this point, the current of the avalanche carrier generated from the p-wells 101 flow to the source regions 102 via the base layer of the p-wells 101. This base layer has a specific resistance $R_B$, and a predetermined level of voltage drop is generated by the current flowing via this specific resistance $R_B$. When the level of voltage drop is beyond a predetermined standard, a current concentration is generated by turning on the emitter-base junction of the parasitic bipolar transistor TR para, whereby the avalanche carriers current is enough to destroy this junction and flows to the source electrode 107 via the n-source regions 102 to destroy them. Accordingly, the PSMOS transistor MOSTR loses its ability to function.

In the conventional art technology, while the p-well of the channel forming portion C underneath the gate is formed with a low density, the rest is formed as a diffused region of high density to reduce a value of the base resistance $R_B$ of a parasitic bipolar transistor. In this case, there is a problem of partial turn-ON of the parasitic bipolar transistor. To solve this problem, a method for preventing a parasitic bipolar transistor from being partially turned on at the portion of the edge is disclosed in the Korean Patent Application No. 91-8714, filed 19 October 91, by equalizing the distance from an outer circumference of a second diffused region in the surface of a unit FET cell. This method, however, manages to prevent the parasitic transistor from being partially turned ON, but is not a fundamental solution preventing avalanche carriers.

SUMMARY OF THE INVENTION

Thus, an object of the present invention is to provide a PSMOS transistor having a protective means which prevents destruction of the PSMOS transistor by avalanche carriers generated at the time of turning OFF the PSMOS transistor with an inductive load.

A PSMOS transistor of the present invention comprises: (1) a semiconductive substrate doped with an impurity of a first conductivity type; (2) a plurality of first semiconductive regions of a second conductivity type formed dispersed at predetermined intervals on the semiconductive substrate; (3) a second semiconductive region of the second conductivity type formed on the semiconductive substrate and spaced from the plurality of the first semiconductive regions; (4) a third semiconductive region of the second conductivity type formed on the semiconductive substrate to have a larger area than that of the second semiconductive region, and spaced f rom the second semiconductive region; (5) a fourth semiconductive region of the second conductivity type formed on the semiconductive substrate, and spaced from the third region; (6) a plurality of source regions of a first conductivity type formed on each of the first semiconductive regions to be shallower than the depth of the first semiconductive regions; (7) gate insulating layers formed on the first to fourth semiconductive regions; (8) a plurality of gate electrodes formed on the gate insulating layers between the first semiconductive region, and the first semiconductive regions and the second semiconductive region; (9) a conductive line formed along the third semiconductive region on the gate insulating layers; (10) a first source electrode connected equally with the plurality of source regions and the first and second semiconductive region, and further contacting a part of the conductive line; (11) a second source electrode for connecting the another part of the conductive line to the fourth semiconductive region; (12) a gate bonding pad formed on the gate insulating layer of the third semiconductive region; and (13) a drain electrode contacting the semiconductive substrate.

According to the PSMOS transistor of the present invention, a sheet resistance region is linked together with a predetermined width along a peripheral portion of an insulating layer interposed between the pad and well-region, and the resistance region is formed to be connected to a well opposed to the pad and a well opposed to another source electrode electrically separated such that avalanche carriers flow to the resistance region and source to prevent the destruction of the element by the avalanche carriers.

BRIEF DESCRIPTION OF THE DRAWINGS

The above objects, features and advantages of the invention are believed to be readily apparent from the following description of a preferred embodiment of the best mode of carrying out the invention when taken in conjunction with the following drawings in which like reference numerals designate like structural elements, wherein.

DETAILED DESCRIPTION OF THE PREFERRED EMBODIMENTS

Figure 1:
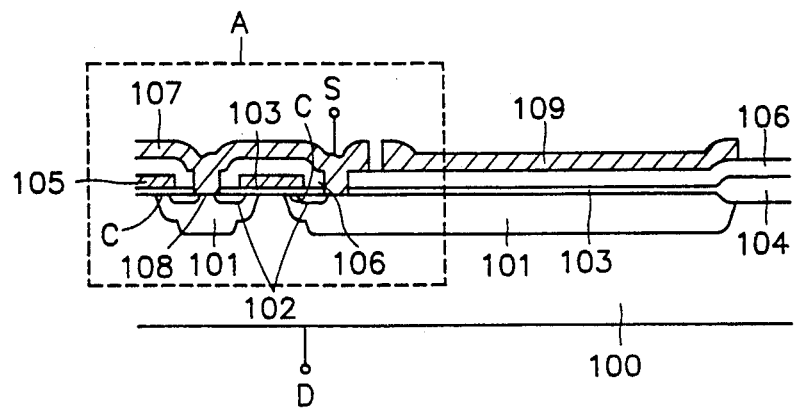
FIGS. 1 and 2 are sectional views depicting a vertical prior art structure and demonstrating the problem of a conventional PSMOS transistor.
Figure 2:
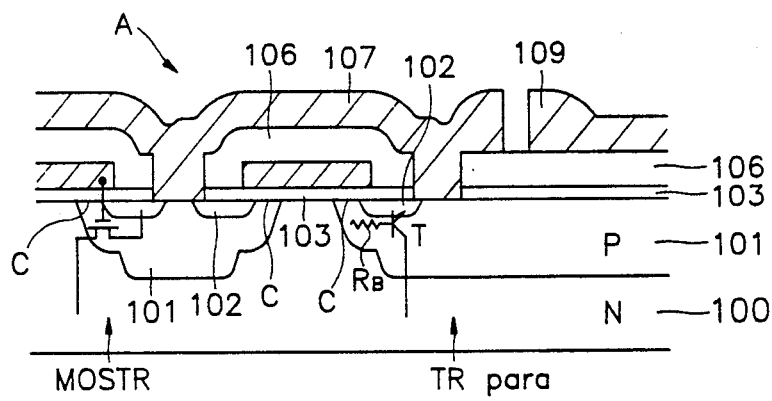
Figure 3:
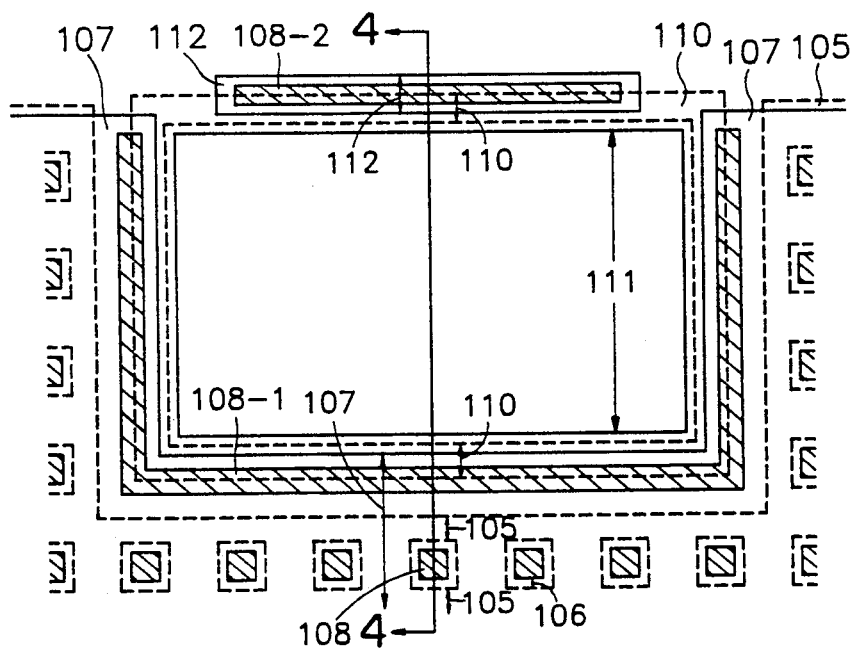
FIG. 3 is a lay-out of a PSMOS transistor according to a preferred embodiment of the present invention.
Figure 4:
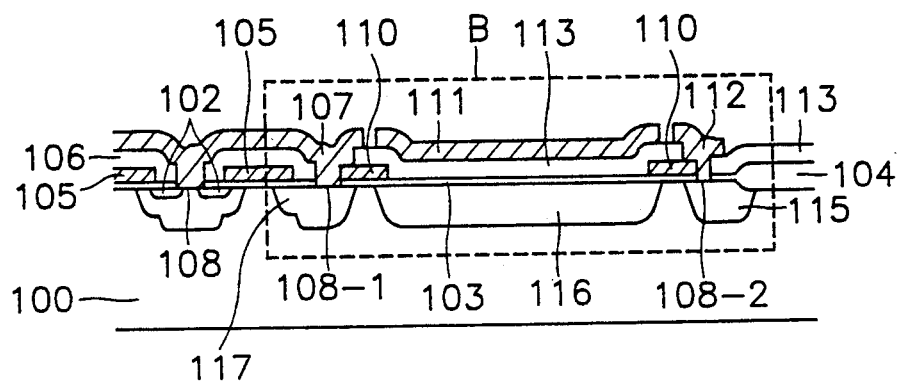
FIG. 4 is a sectional view taken along lines A-A' of FIG. 3.

In the lay-out of a power switching MOS transistor shown in FIG. 3 and the sectional view taken along lines A-A' shown in FIG. 4, there is depicted a sectional structure of a PSMOS transistor formed according to a first preferred embodiment of the invention. In the sectional structure of FIG. 4, the parts except "B" are the same as those of FIG. 1, and the part "B" is different from FIG. 1. Accordingly, the description of the portions similar to those of FIG. 1 is omitted, and the part "B" is now described in detail.

Part "B" of FIG. 4 identifies a region where a parasitic bipolar transistor and a gate bonding pad are formed. A conventional high density p-well is formed underneath a gate bonding pad and source regions 102 as shown in FIG. 1, and according to FIG. 4 of the present invention, there are a high density p-well 116 corresponding to a gate bonding pad 111; another high density p-well 117 is formed underneath gate electrode 105 and a source electrode 107, in spaced relationship from the p-well 116; and a high density p-well 115 is formed around field oxide films 104, in spaced relationship therefrom. And an impurity region of the opposite conductivity type to that of the p-well is formed in p-well 117. Conductive layers 110 are formed on both end portions of double layered insulating layers 103 and 113 between the gate bonding pad 111 and p-well 116, and the side-end portions of each conductive layer 110 are connected to the source electrode 107 and a separated source electrode 112.

Conductive layers 110 are preferably formed of polysilicon in the form of a sheet resistance. However, the conductive layers 110 are not limited thereto, and may be formed of any conductive material, e.g. doped polysilicon, Al, W, etc. The source electrode 112 contacts the p-well 115 formed on the substrate via a window, and is connected to the source electrode 107 via a conductive layer 110, as shown in FIG. 3. That is, the source electrode 112 is separately placed, but is electrically connected to the other elements, to have the same function as that of the source electrode 107. Such a relationship of connecting the regions to each other is fully depicted in FIG. 3, and, for example, metal electrode layers, polysilicon layers and contact portions are shown respectively in solid line, dotted line and hatched lines. Even though a well or an impurity-diffused region is shown with no particular line designation, as can be seen in FIG. 3, the conductive layers 110 formed of polysilicon sheet resistance are connected to each other along the gate bonding pad 111, and the source electrodes 107 and 112 are also connected to each other.

The PSMOS transistor including the part "B" may have an inductive load. The description of the influence of the inductive load according to the turn ON/turn OFF at the time of the switching operation of the PSMOS transistor is as follows.

In the case where the MOS transistor is turned OFF, avalanche carriers are generated between the substrate 100 and the well region 115, and these avalanche carriers flow along the conductive layers 110 formed of polysilicon sheet resistance via the separated source electrode 112 connected to the well region 115 to form a current path to the source electrode 107. The avalanche carriers of the p-well region 116 underneath the gate bonding pad 111 and the p-well region 115 underneath the field oxide film then flow to the grounded source electrode 112 and 107 at an initial stage, thereby preventing the PSMOS transistor from being destroyed.

According to the type of sheet resistance, such as polysilicon, the switching element can be protected by the flow of the avalanche carriers generated underneath the gate bonding pad and guard ring to the source electrode via the polysilicon sheet resistance, other than passing the avalanche carrier via the p-well type semiconductor layer, a base layer of the NPT-type parasitic bipolar transistor. That is, since the avalanche carrier does not flow to the source regions 102 but to the source electrodes, the PSMOS transistor can be protected.

It is important that the P-well 116, a p-type semiconductor region placed underneath the gate bonding pad and the conductive layers 110 of polysilicon sheet resistance, be kept electrically short-circuited, and at the same time, these conductive layers should be connected to the source electrodes 112 and 107.

Figure 7A:
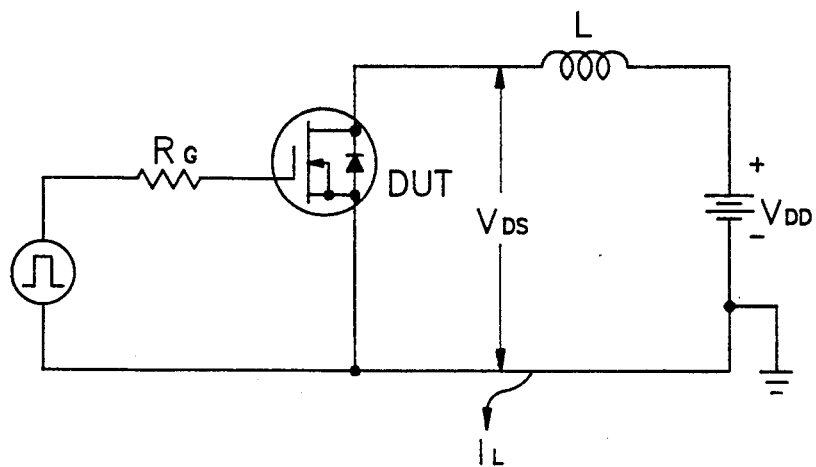
FIGS. 7A, 7B and 7C respectively illustrate a measurement circuit for testing the operation of a power MOS transistor of the present invention and graphs illustrating the results obtained thereby.

FIGS. 7A is a circuit diagram of a test circuit for measuring the characteristics of the PSMOS transistor when the MOS transistor of the present invention is connected to an inductive load. The reference letters appearing in FIG. 7A designate the following elements: (1) current from source $I_L$; (2) voltage between the drain and source $V_{DS}$; and (3) inductive load L. Further, $V_{DS}$ and $I_L$ in accordance with the turn-ON and turn-OFF of the MOS transistor are gauged by applying a pulses voltage via a resistance $R_G$ to a gate of the MOS transistor device under test (DUT).

Figure 7B:
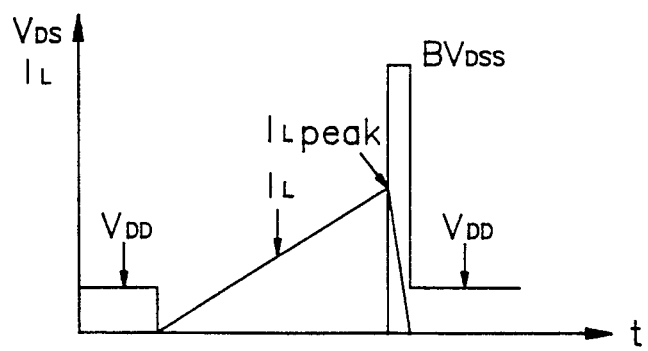
Figure 7C:
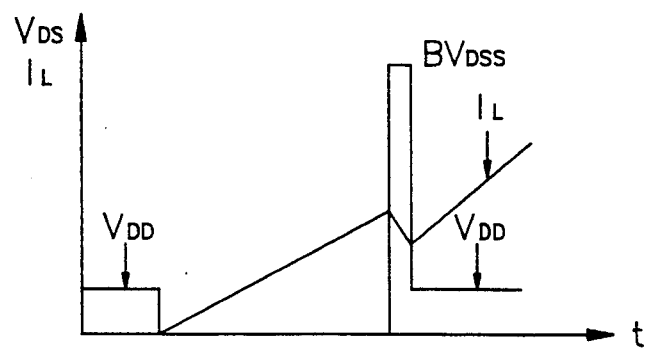

FIG. 7B depicts the relationship of $V_{DS}$ and $I_L$ with respect to time in the case of normal operation of the PSMOS of the present invention. FIG. 7C is a graph showing the case where the DUT is broken down. In the case of FIG. 7B, as a gate voltage is applied to the gate of the DUT, the DUT is turned ON, and the drain current $I_L$ attains a peak value $I_L$. At this point, the energy of a predetermined level ($E = 1/2L\ I_L^2$) is stored in a load coil L. If the gate voltage drops to 0 volts, the DUT changes into the avalanche state by the flyback voltage generated by the load coil L. At this point, the flyback voltage is limited by the breakdown voltage of the diode between the drain and the source of the DUT.

While the DUT repeats such an operation, if a parasitic bipolar junction transistor is turned ON, a current concentration phenomenon occurs on the part that is turned ON, and the DUT is eventually broken down.

In FIGS. 7B and 7C, $BV_{DDS}$ designates the breakdown voltage, and in the case of turn-OFF, it is apparent that the $V_{DS}$ voltage is stabilized by changing directly into the $V_{DD}$ level.

The device of the present invention is at least twice, and at its maximum five times, as durable as a device manufactured by the conventional art technology, under the same operating conditions.

Figure 5:
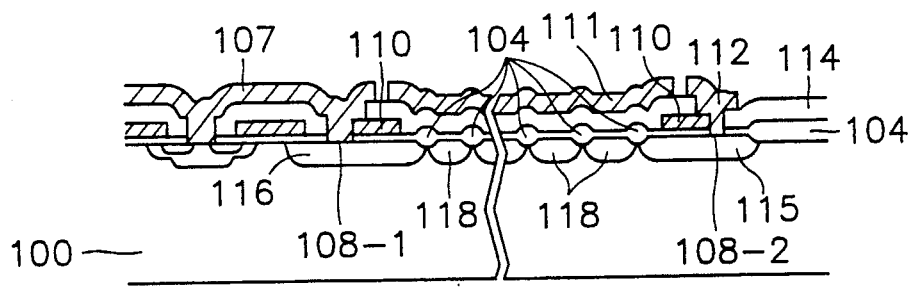
FIGS. 5 and 6 are sectional views according to respective 2nd and 3rd preferred embodiments of the present invention.

The second embodiment of the invention as illustrated in FIG. 5 is similar to the first embodiment, and reduces the effect of the current density by the avalanche carriers generated from well-regions 118 according to division into the small well-regions 118, namely a p-well 116 disposed underneath a gate bonding pad 111 having a relatively broad area in the first preferred embodiment. With reference to FIG. 5, a plurality of well-regions 118 are separated from each other by field oxide films 104, but connected to each other electrically.

Figure 6:
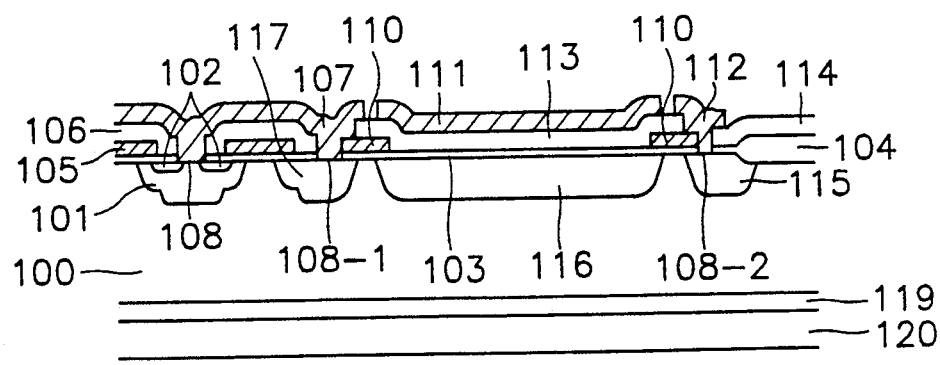

Similarly, the third embodiment as shown in FIG. 6 has the same structure as that of the first embodiment as shown in FIG. 4; however unlike the first embodiment, there are formed a high density semiconductive layer 119 of the same conductivity as that of the substrate 100 and another high density semiconductive layer 120 of the opposite type conductivity to that of the semiconductive layer 119 underneath the substrate 100, thereby forming an insulated gate bipolar transistor (IGBT) with the p-type high density semiconductive layer 120, N-type semiconductive layers 100 and 119, and a plurality of p-type high density semiconductive layers 101 respectively serving as collector, gate and emitter. According to this embodiment, a PNP-type bipolar transistor is formed by adding two semiconductive layers 119 and 120 having the opposite conductivity to each other, which is a power-controlling element improving the current driving ability. The avalanche carriers generated at the time of turn-OFF flow to ground, the source electrodes 107, by way of polysilicon resistances 110 via a p-well 115, and therefore, the neighbouring MOS transistor cell can be protected, as in the first preferred embodiment.

As has been described above, according to the PSMOS transistor of the present invention having a structure that can be effectively protected from the influence of the inductive load inevitably generated in the application of a circuit, a more reliable element can be provided, thereby having a wide application and broadening the scope of design. The structure of VDMOS has been especially described as a preferred embodiment. The embodiments disclosed herein can be applied to another switching element applying the principle of the present invention. Additionally, it is possible to have a structure of elements having the opposite type conductivity to those of the preferred embodiments of the present invention.

It is understood that the above description is for the purpose of describing the various embodiments of the inventions, and those skilled in the PSMOS transistor art will recognize that various modifications and changes can be made without departing from the scope of the invention, which scope is to be determined by the following claims and the equivalents to which the elements thereof are entitled.

What is claimed is:

1. A power switching metal oxide semiconductor (PSMOSO) transistor, comprising:

a semiconductor substrate doped with an impurity having a first type conductivity;

a plurality of first semiconductive regions of a second type conductivity dispersed at predetermined intervals on said semiconductive substrate;

a second semiconductive region of said second type conductivity type formed on said semiconductive substrate and spaced from said plurality of first semiconductive regions;

a third semiconductive region of said second type conductivity formed on said semiconductive substrate to have a larger area than that of said second semiconductive region and spaced therefrom;

a fourth semiconductive type region of said second type semiconductivity formed on said semiconductive substrate spaced from said third region;

a plurality of source regions of said first type conductivity formed on each of said first semiconductive regions to be shallower than the depth of said first semiconductive regions;

gate insulating layers formed on said first to fourth semiconductive regions;

a plurality of gate electrodes formed on said gate insulating layers between said first and said second semiconductive region;

a conductor formed in in a band shape along the boundary of said third semiconductive region on said gate insulating layers such that avalanche carriers flow to said conductor and said first source electrode to prevent destruction of the PSMOS transistor by avalanche carriers;

a first source electrode connected equally to said plurality of source regions and said first and said second semiconductive regions, and further contacting a part of said conductive line;

said first source electrode for connecting said another part of said conductive line to said fourth semiconductive region;

a gate bonding pad formed on the gate insulating layer of said third semiconductive region; and a drain electrode contacting said semiconductive substrate.

2. The PSMOS transistor according to claim 1, wherein said second and fourth semiconductive regions are formed of the same semiconductive regions as the third semiconductive region, and said first semiconductive regions are partially connected to said third semiconductive region through said first source electrode.

3. The PSMOS transistor according to claim 1, wherein said third semiconductive region is divided into a plurality of regions, and said divided plurality of regions is partially connected to each other.

4. The PSMOS transistor according to claim 1, wherein said conductor is chosen from the group comprising polysilicon, Al, W and doped polysilicon.

5. The PSMOS transistor according to claim 1, wherein said first semiconductive regions include a high density diffused region and a low density diffused region formed outside said high density diffused region to be shallower than said high density diffused region.

6. The PSMOS transistor according to claim 1, wherein said second and fourth semiconductive regions are respectively formed of high density diffused regions.

7. The PSMOS transistor according to claim 1, wherein said third semiconductive region is one of circular and polygonal shape.

8. The PSMOS transistor according to claim 1, further comprising a high density semiconductive layer of the same type conductivity as that of said semiconductive substrate underneath said semiconductive substrate, and a high density semiconductive layer of a second conductivity underneath said high density semiconductive layer.

* * * * *